United States Patent
Furuya et al.

(10) Patent No.: US 7,548,700 B2
(45) Date of Patent: Jun. 16, 2009

(54) RECEIVING APPARATUS AND METHOD THEREOF

(75) Inventors: Miki Furuya, Yokohama (JP); Yukiko Takiba, Kawasaki (JP); Hiroshi Suzunaga, Kawasaki (JP)

(73) Assignee: Kabushiki Kaisha Toshiba, Tokyo (JP)

(*) Notice: Subject to any disclaimer, the term of this patent is extended or adjusted under 35 U.S.C. 154(b) by 503 days.

(21) Appl. No.: 11/470,356

(22) Filed: Sep. 6, 2006

(65) Prior Publication Data
US 2007/0075751 A1    Apr. 5, 2007

(30) Foreign Application Priority Data
Sep. 28, 2005    (JP)    ............... 2005-281499

(51) Int. Cl.
*H04B 10/06*    (2006.01)
(52) U.S. Cl. .................. 398/202; 398/208; 398/210
(58) Field of Classification Search .................. 398/16, 398/24, 25, 33, 154, 155, 158, 202–204, 398/206–210, 213
See application file for complete search history.

(56) References Cited

U.S. PATENT DOCUMENTS

| | | | | |
|---|---|---|---|---|
| 5,777,507 A * | 7/1998 | Kaminishi et al. | .......... | 327/514 |
| 6,130,662 A * | 10/2000 | Umeda | .............. | 345/158 |
| 6,246,499 B1 * | 6/2001 | Kunito et al. | .............. | 398/162 |
| 7,002,881 B2 * | 2/2006 | Okuda et al. | ............. | 369/44.41 |
| 7,092,644 B2 * | 8/2006 | Davidson | ................. | 398/202 |
| 7,449,669 B2 * | 11/2008 | Sakura | .................. | 250/214 A |
| 2004/0100317 A1 | 5/2004 | Suzunaga | | |

FOREIGN PATENT DOCUMENTS

| | | |
|---|---|---|
| JP | 8-4755 | 2/1996 |
| JP | 2003-198295 | 7/2003 |

OTHER PUBLICATIONS

U.S. Appl. No. 11/445,306, filed Jun. 2, 2006, Hiroshi Suzunaga.

* cited by examiner

*Primary Examiner*—Dalzid Singh
(74) *Attorney, Agent, or Firm*—Oblon, Spivak, McClelland, Maier & Neustadt, P.C.

(57) ABSTRACT

According to the invention, there is provided a receiving apparatus including: a first threshold voltage generation unit which generates a first threshold voltage lower than substantially half of a peak voltage of the voltage signal; a second threshold voltage generation unit generating a second threshold voltage lower by the first threshold voltage than the peak voltage of the voltage signal; and a selection unit which, when the voltage signal changes from a first potential to a second potential higher than the first potential, selects and outputs the second threshold voltage after exceeding the first threshold voltage, and when the voltage signal changes from the second potential to the first potential, selects and outputs the first threshold voltage after falling below the second threshold voltage.

20 Claims, 11 Drawing Sheets

RECEIVING APPARATUS AND METHOD THEREOF

CROSS REFERENCE TO RELATED APPLICATION

This application is based upon and claims the benefit of priority under 35 USC 119 from the Japanese Patent Application No. 2005-281499, filed on Sep. 28, 2005, the entire contents of which are incorporated herein by reference.

BACKGROUND OF THE INVENTION

There is a receiving apparatus which receives an optical signal transmitted from a light emitting element by use of a light receiving element. Such receiving apparatus converts a current signal obtained by receiving an optical signal into a voltage signal and compares the voltage signal with a predetermined threshold voltage to thereby generate and output a digital signal.

However, in the receiving apparatus, when the signal level of voltage signal is large and saturation occurs (ie., the dynamic range is exceeded), there may be a case where the digital signal cannot be properly generated. In order to prevent this phenomenon, there has been proposed that, in the receiving apparatus, the signal level of voltage signal is adjusted so that a threshold voltage is positioned substantially near the center of the amplitude range of the voltage signal and then comparison with the threshold voltage is performed to conduct binarization. The names of documents on the receiving apparatus which receives an optical signal are described below. Japanese Patent Laid-Open No. 2004-179982 (FIG. 1) Japanese Utility Model Publication No. 8-4755 (FIG. 1)

SUMMARY OF THE INVENTION

A receiving apparatus according to one aspect of the present invention includes: a light receiving unit which receives an optical signal and generates a current signal dependent on the optical signal; a conversion unit which converts the current signal into a voltage signal; a first threshold voltage generation unit which generates a first threshold voltage lower than substantially half of a peak voltage of the voltage signal; a second threshold voltage generation unit which generates a second threshold voltage lower by the first threshold voltage than the peak voltage of the voltage signal; a selection unit which, when the voltage signal changes from a first potential to a second potential higher than the first potential, selects and outputs the second threshold voltage after the voltage signal exceeding the first threshold voltage, and when the voltage signal changes from the second potential to the first potential, selects and outputs the first threshold voltage after the voltage signal falling below the second threshold voltage; and a comparison unit which compares the voltage signal with the first or second threshold voltage outputted from the selection unit.

A receiving method according to one aspect of the present invention includes: receiving an optical signal and generating a current signal dependent on the optical signal; converting the current signal into a voltage signal; generating a first threshold voltage lower than substantially half of a peak voltage of the voltage signal; generating a second threshold voltage lower by the first threshold voltage than the peak voltage of the voltage signal; selecting the second threshold voltage after the voltage signal exceeding the first threshold voltage, when the voltage signal changes from a first potential to a second potential higher than the first potential, and selecting the first threshold voltage after the voltage signal falling below the second threshold voltage, when the voltage signal changes from the second potential to the first potential; and comparing the voltage signal with the first or second threshold voltage thus selected.

DETAILED DESCRIPTION OF THE INVENTION

Embodiments of the present invention will be described below with reference to the drawings.

Figure 1:
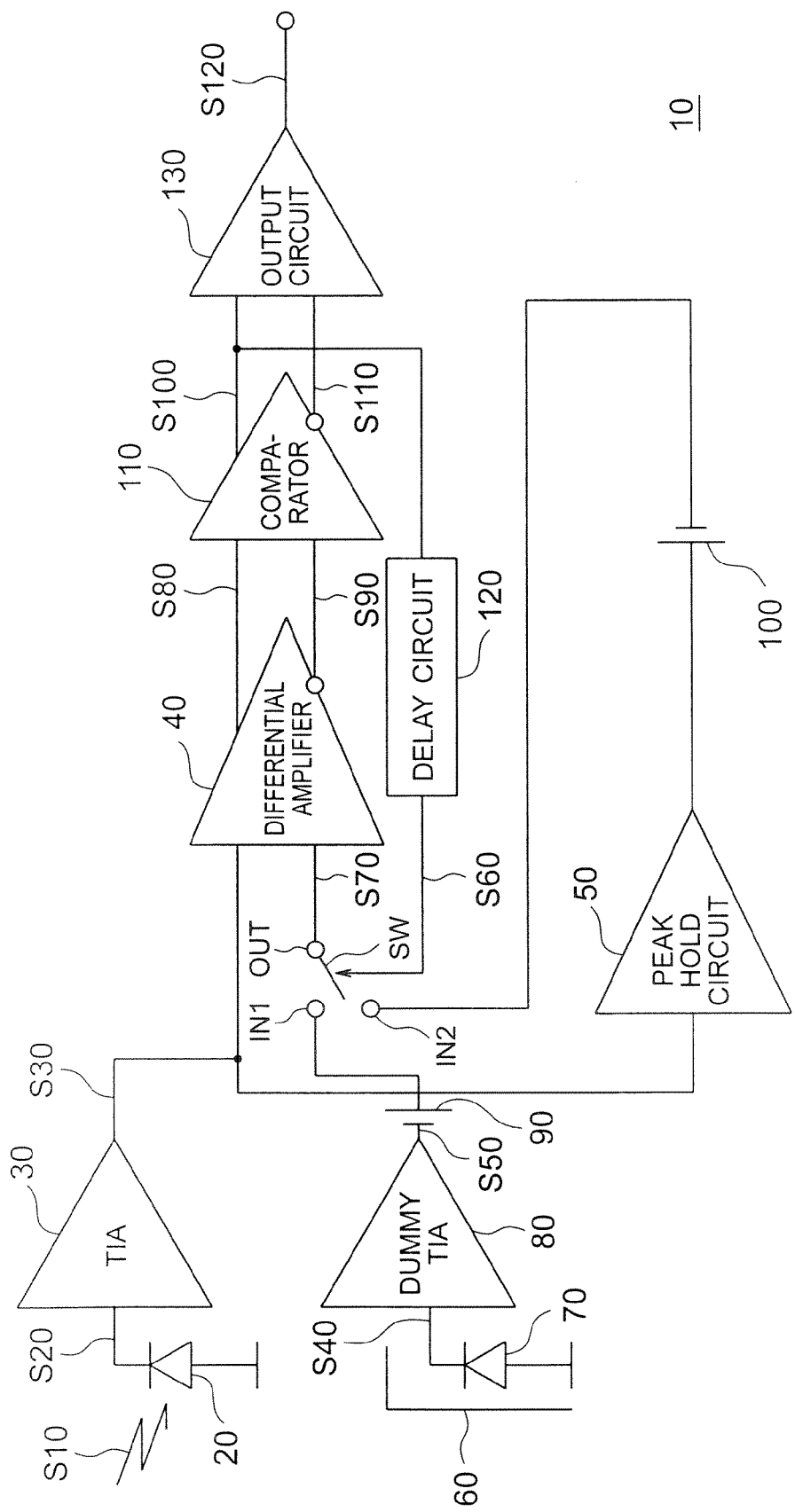
FIG. 1 is a block diagram showing a configuration of a receiving apparatus according to an embodiment of the present invention.
Figure 2:
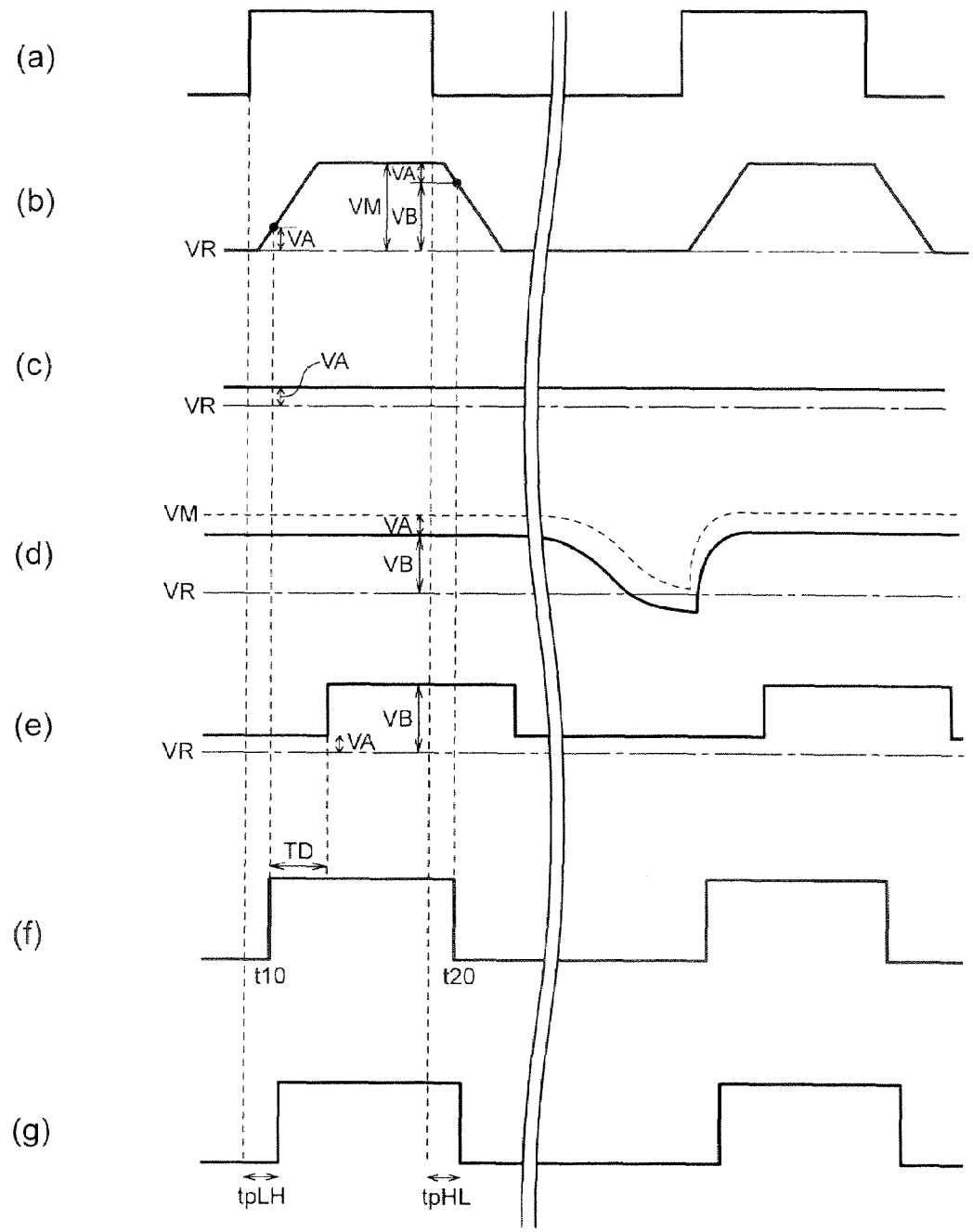
FIG. 2 shows signal waveforms of each signal obtained in the receiving apparatus.

FIG. 1 shows a configuration of a receiving apparatus 10 according to an embodiment of the present invention. FIG. 2 shows signal waveforms of each signal obtained in the receiving apparatus 10. The receiving apparatus 10 is used, for example in a receiving side such as a photo coupler or an optical digital data link transmitting an optical signal between a light emitting element and receiving element.

The receiving apparatus 10 has a photodiode 20 as the receiving element. The anode of the photodiode 20 is connected to ground GND, and the cathode thereof is connected to an input terminal of a trans-impedance amplifier (TIA) 30.

In the receiving apparatus 10, an optical signal S10 (FIG. 2(A)) generated by a light emitting element of a transmitting apparatus (not shown) and transmitted thereto is received by the photodiode 20. This optical signal S10 has rectangular shaped pulse; for example, "H" level is generated by causing the light emitting element to output light, and "L" level is generated by causing the light emitting element not to output light.

The photodiode 20 generates a current signal S20 dependent on the optical signal S10 received and outputs this to the trans-impedance amplifier 30. The trans-impedance amplifier 30 converts this current signal S20 into a voltage signal S30 (FIG. 2(B)) and outputs this to a first input terminal of a differential amplifier 40 and a peak hold circuit 50.

As shown in FIG. 2(B), in this voltage signal S30, its takes a certain time to change from "L" level to "H" level and to change from "H" level to "L" level, respectively, so this signal has trapezoidal shaped pulse.

In the present embodiment, as a circuit for generating a reference potential, there are provided a light shielding unit 60, a dummy photodiode 70 and a dummy trans-impedance amplifier (dummy TIA) 80.

The light shielding unit 60 is disposed so that the dummy photodiode 70 receives no optical signal S10. Accordingly, the dummy trans-impedance amplifier 80 converts a current signal S40 generated by noises etc. into a voltage signal S50 and thereby generates reference potential VR (FIG. 2(B)) corresponding to "L" level of the voltage signal S30 outputted from the trans-impedance amplifier 30.

An output terminal of the dummy trans-impedance amplifier 80 is connected to a negative pole of a constant voltage source 90 causing voltage VA to be generated. A positive pole of the constant voltage source 90 is connected to a first input terminal IN1 of a switch SW. Accordingly, at the first input terminal IN1 of the switch SW, there is generated first threshold voltage VA (FIG. 2(C)) higher by voltage VA than reference potential VR. This first threshold voltage VA is selectable within a range of voltage lower than approximately half of peak voltage VM (FIG. 2(B)) of the voltage signal S30 outputted from the trans-impedance amplifier 30.

The peak hold circuit 50 holds peak voltage VM (FIG. 2(D)) of the voltage signal S30 outputted from the trans-impedance amplifier 30 for a predetermined time period. An output terminal of the peak hold circuit 50 is connected to a positive pole of the constant voltage source 100 causing voltage VA to be generated. A negative pole of the constant voltage source 100 is connected to a second input terminal IN2 of the switch SW. Accordingly, at the second input terminal IN2 of the switch SW, there is generated second threshold voltage VB (FIG. 2(D)) lower by first threshold voltage VA than peak voltage VM of the voltage signal S30.

The switch SW changes its connection status on the basis of a switching signal S60 supplied from a comparator 110 via a delay circuit 120. More specifically, when the voltage signal S30 (FIG. 2(B)) is "L" level, the switch SW changes its connection status to the first input terminal IN1 side and thereby selects first threshold voltage VA (FIG. 2(E)).

In this status, when the voltage signal S30 (FIG. 2(B)) changes from "L" level to "H" level, the switch SW changes, based on a timing when that voltage signal S30 (FIG. 2(B)) changes to "H" level, its connection status from the first input terminal IN1 side to the second input terminal IN2 side and thereby selects second threshold voltage VB (FIG. 2(E)).

Further, in this status, when the voltage signal S30 (FIG. 2(B)) changes from "H" level to "L" level, the switch SW changes, based on a timing of changing to "L" level, its connection status from the second input terminal IN2 side to the first input terminal IN1 side and thereby selects first threshold voltage VA (FIG. 2(E)).

The threshold voltage signal S70 (FIG. 2(E)) generated in this manner is supplied to a second input terminal of the differential amplifier 40. The differential amplifier 40 amplifies a voltage difference between the voltage signal S30 received via the first input terminal and the threshold voltage signal S70 received via the second input terminal and outputs a resultant voltage signal S80 from a first output terminal and at the same time, outputs a voltage signal S90 obtained by inverting the voltage signal S80 from the second output terminal.

The comparator 110 compares, based on the voltage signals S80 and S90 received via the first and second input terminals, the voltage signal S30 (FIG. 2(B)) outputted from the trans-impedance amplifier 30 with the threshold voltage signal S70 (FIG. 2(E)).

As a result, the comparator 110 generates a voltage signal S100 (FIG. 2(F)) which changes from "L" level to "H" level at a timing (time point t10) when the potential of voltage signal S30 (FIG. 2(B)) exceeds first threshold voltage VA of threshold voltage signal S70 (FIG. 2(E)), and which changes from "H" level to "L" level at a timing (time point t20) when the potential of voltage signal S30 (FIG. 2(B)) falls below second threshold voltage VB of threshold voltage signal S70 (FIG. 2(E)).

This voltage signal S100 is outputted from a first output terminal of the comparator 110 and supplied to a first input terminal of an output circuit 130 and at the same time, after delayed by predetermined time TD by the delay circuit 120 (FIG. 2(F)), supplied to the switch SW as a switching signal S60.

In this case, when the switching signal S60 is "L" level, the switch SW changes its connection status to the first input terminal IN1 side to thereby select first threshold voltage VA; when the switching signal S60 is "H" level, the switch SW changes its connection status to the second input terminal IN2 side to thereby select second threshold voltage VB. In this manner, when the status of the switch SW is changed on the basis of the voltage signal S100 outputted from the comparator 110, threshold voltage can be properly selected.

Meanwhile, when generating the voltage signal S100, the comparator 110 also generates a voltage signal S110 obtained by inverting the voltage signal S100 and outputs this from a second output terminal thereof. When receiving the voltage signals S100 and S110 from the first and second input terminals, the output circuit 130 amplifies the voltage signal S100 received from the first input terminal and outputs a resultant output signal S120 (FIG. 2(G)) to the outside.

A time period from a timing when the optical signal S10 (FIG. 2(A)) changes from "L" level to "H" level to a timing when the output signal S120 (FIG. 2(G)) changes from "L" level to "H" level is referred to as propagation delay time to logic low output tpLH; a time period from a timing when the optical signal S10 (FIG. 2(A)) changes from "H" level to "L" level to a timing when the output signal S120 (FIG. 2(G)) changes from "H" level to "L" level is referred to as propagation delay time to logic high output tpHL.

In this manner, according to the present embodiment, when the voltage signal S30 changes from "L" level to "H" level (i.e., when it rises), voltage VA lower than approximately half of peak voltage VM (FIG. 2(B)) of the voltage signal S30 is used as threshold voltage; when the voltage signal S30 changes from "H" level to "L" level (i.e., when it falls), voltage VB lower by that voltage VA than peak voltage VM is used as threshold voltage.

That is, threshold voltage is changed according to whether the voltage signal S30 to be compared rises or falls. Accordingly, compared to when approximately half of peak voltage VM is used as a constant threshold voltage, effects by rise time (a time period taken for the voltage signal S30 (FIG. 2(B)) to change from "L" level to "H" level) and fall time (a time period taken for the voltage signal S30 (FIG. 2(B)) to change from "H" level to "L" level) can be reduced, and propagation delay time to logic low output tpLH and propagation delay time to logic high output tpHL can be shortened.

Meanwhile, in the peak hold circuit 50, when no optical signal S10 of "H" level is received by the photodiode 20 for a certain time and peak voltage VM is not supplied from the trans-impedance amplifier 30 for a certain time, the voltage held therein gradually lowers due to discharging (FIG. 2(D)).

However, as in the present embodiment, if first threshold voltage VA is used when rising, even when the voltage outputted from the peak hold circuit 50 lowers and the voltage generated at the second input terminal IN2 lowers, there occurs no difference in timing when the voltage signal S100 (FIG. 2(F)) outputted from the comparator 110 changes from "L" level to "H" level. Accordingly, occurrence of pulse width distortion can be suppressed.

In the present embodiment, when falling, second threshold voltage VB lower by first threshold voltage VA than peak voltage VM is used. Thus, propagation delay time to logic low output tpLH and propagation delay time to logic high output tpHL can be made substantially equal to each other. Consequently, pulse width distortion can be reduced.

Figure 3:
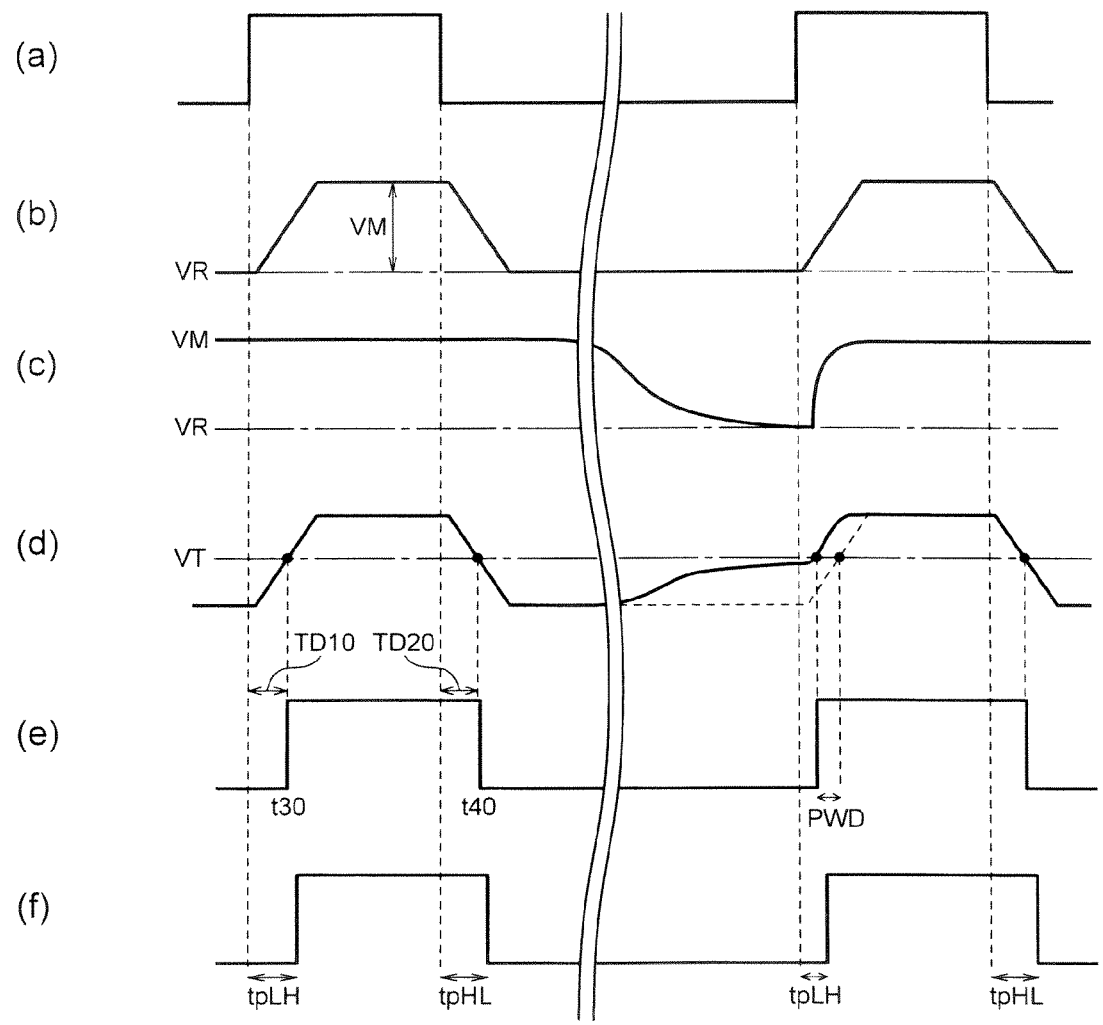
FIG. 3 shows signal waveforms of each signal obtained in a receiving apparatus being a comparative example.

Here, as a first comparative example, FIG. 3 shows signal waveforms of each signal obtained when a voltage signal (FIG. 3(B)) outputted from the trans-impedance amplifier is lowered by a voltage corresponding to approximately half of peak voltage VM of that voltage signal (FIG. 3(B)) and threshold voltage VT is thereby positioned substantially near the center of amplitude range of the voltage signal (FIG. 3(D)) and then comparison with threshold voltage VT is performed.

In this first comparative example, there is generated a voltage signal (FIG. 3(E)) which changes from "L" level to "H"

level at a timing (time point t30) when the potential of voltage signal (FIG. 3(D)) exceeds threshold voltage VT, and changes from "H" level to "L" level at a timing (time point t40) when the potential of voltage signal (FIG. 3(D)) falls below threshold voltage VT.

Consequently, as propagation delay time to logic low output tpLH and propagation delay time to logic high output tpHL (FIG. 3(F)), at least time TD10 and TD20 corresponding to half of rise and fall time of the voltage signal (FIG. 3(D)) is required; propagation delay time cannot be further shortened.

In contrast, according to the present embodiment, relative to a time period corresponding to half of rise and fall time, propagation delay time to logic low output tpLH and propagation delay time to logic high output tpHL can be further shortened.

Also, in the case of this first comparative example, as in the present embodiment, when no optical signal (FIG. 3(A)) of "H" level is received for a certain time and peak voltage VM is not supplied from the trans-impedance amplifier to the peak hold circuit for a certain time, the voltage held in the peak hold circuit gradually lowers and later lowers to reference potential VR (FIG. 3(C)).

In this status, even when an optical signal (FIG. 3(A)) of "H" level is received, in the vicinity of rising of the voltage signal (FIG. 3(B)) outputted from the trans-impedance amplifier, the voltage held by the peak hold circuit is smaller than peak voltage VM (FIG. 3(C)). Thus, the voltage signal (FIG. 3(D)) to be compared is higher than its original potential in the vicinity of rising thereof.

Accordingly, the timing when the voltage signal (FIG. 3(E)) outputted from the comparator changes from "L" level to "H" level is shorter than its original value, causing pulse width distortion PWD (FIG. 3(E)).

In contrast, according to the present embodiment, when rising, not the voltage generated on the basis of the voltage held by the peak hold circuit 50 but first threshold voltage VA is used. Consequently, occurrence of pulse width distortion can be suppressed.

Here, as a second comparative example, there will be described a technique which as threshold voltage used for comparison with an output signal outputted from the light receiving element, uses a predetermined reference voltage when the output signal rises, and when the output signal falls, uses a voltage which is higher than the reference voltage and which corresponds to a time average value of an output signal outputted from the comparator circuit.

In the case of this second comparative example, according to signal waveform of optical signal, i.e., the ratio between "H" level period and "L" level period, the threshold voltage used when rising changes. Consequently, there occurs lengthening of propagation delay time to logic high output tpHL. Also, there occurs a variation in propagation delay time to logic high output tpHL.

In contrast, according to the present embodiment, based on peak voltage VM held by the peak hold circuit 50, second threshold voltage VB used when falling is generated. Accordingly, irrespective of signal waveform of optical signal S10, i.e., the ratio between "H" level period and "L" level period, second threshold voltage VB used when falling can be made constant.

Consequently, lengthening of propagation delay time to logic high output tpHL, and a variation in propagation delay time to logic high output tpHL can be suppressed. Accordingly, propagation delay time to logic high output tpHL can be shortened and at the same time, occurrence of pulse width distortion can be suppressed.

Figure 4:
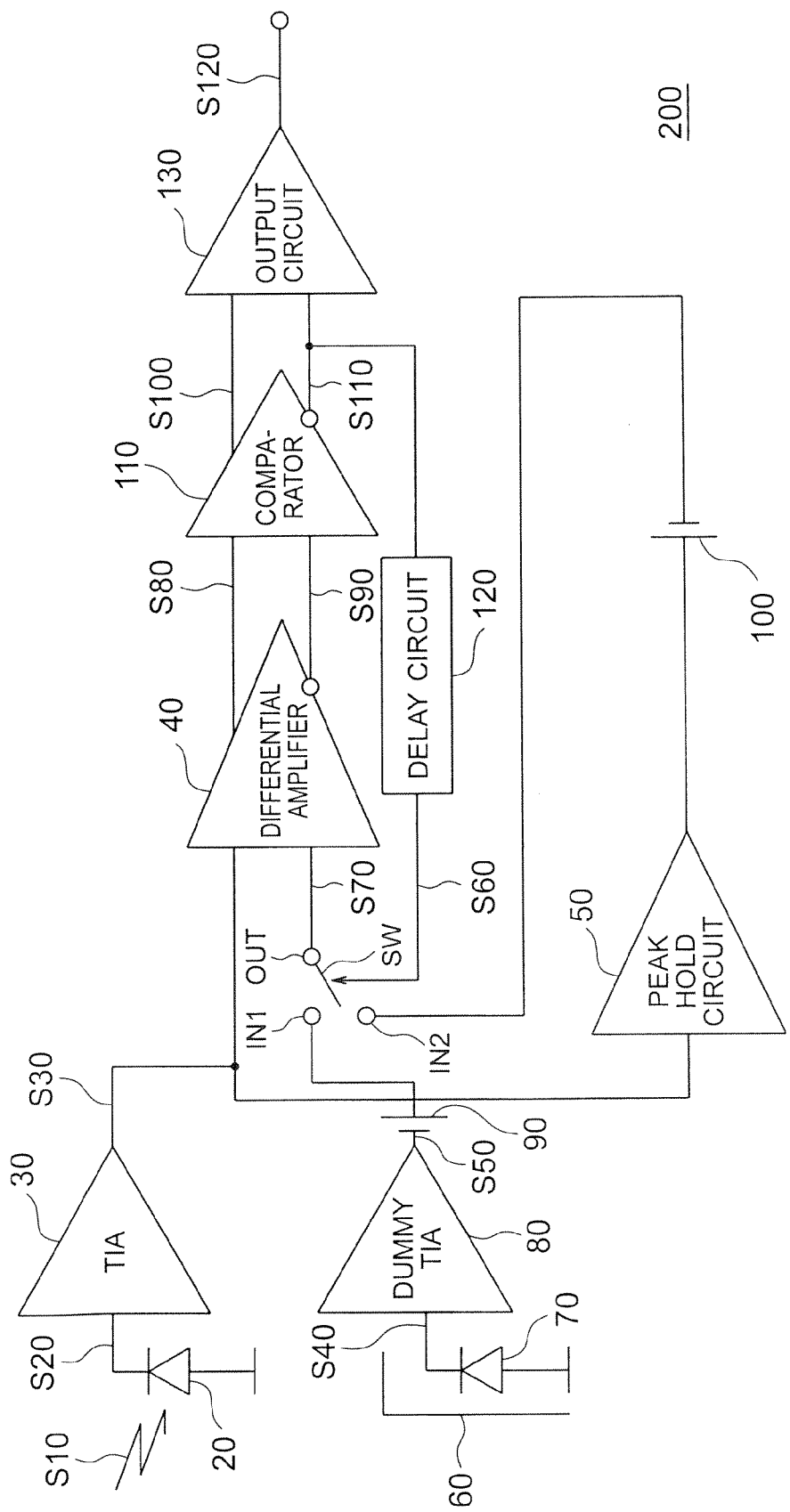
FIGS. 4-11 are block diagrams showing a configuration of a receiving apparatus according to another embodiment respectively.

The above described embodiment is an example, and the present invention is not limited thereto. For example, as shown in FIG. 4, based on a voltage signal S110 obtained by inverting a voltage signal S100 and outputted from the second output terminal of the comparator 110, the connection status of the switch SW may be changed.

Figure 5:
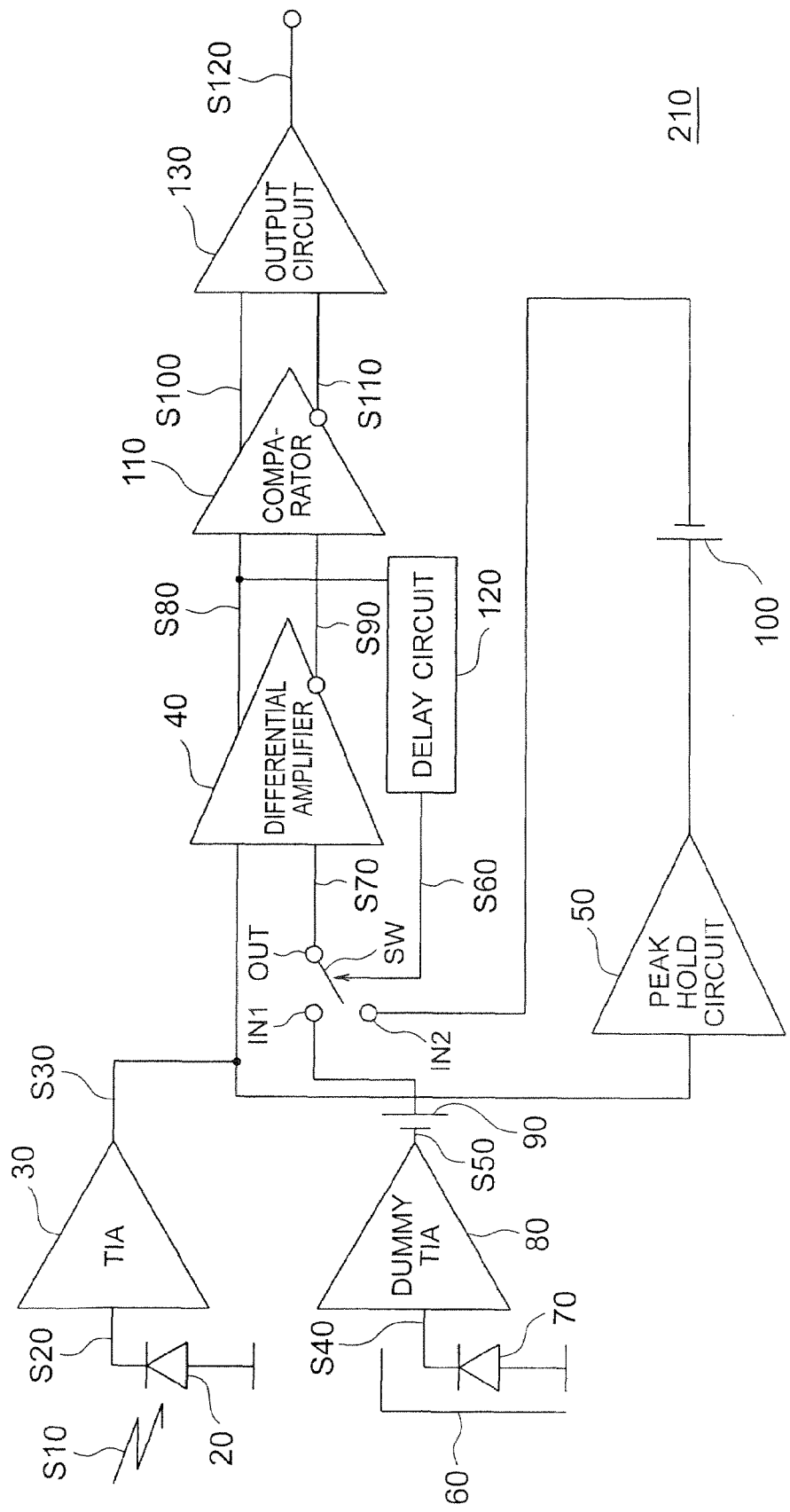
Figure 6:
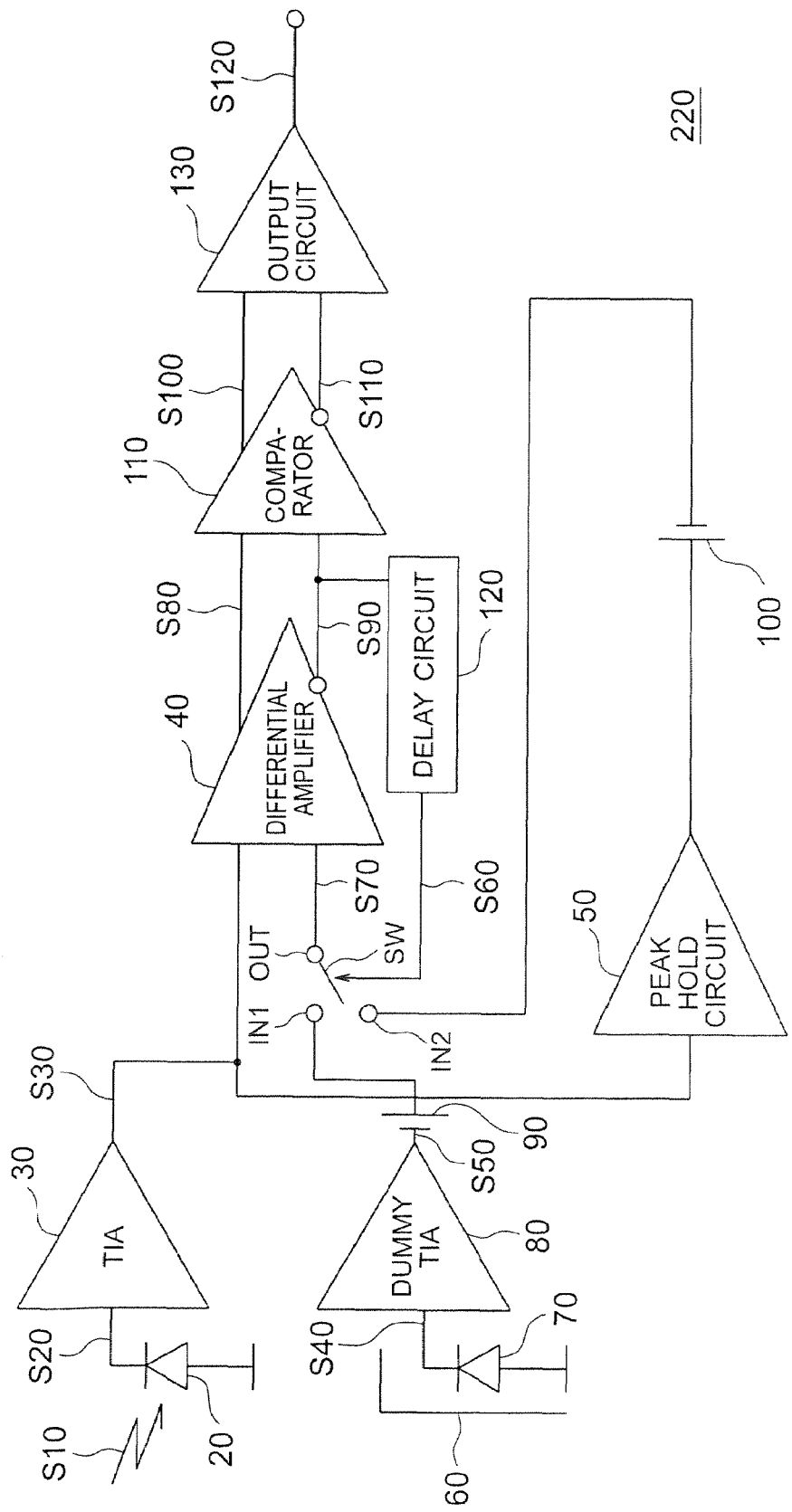

Also, as shown in FIG. 5, based on a voltage signal S80 outputted from the first output terminal of the differential amplifier 40, the connection status of the switch SW may be changed. Also, as shown in FIG. 6, based on a voltage signal S90 obtained by an inverting voltage signal S80 and outputted from the second output terminal of the differential amplifier 40, the connection status of the switch SW may be changed.

Figure 7:
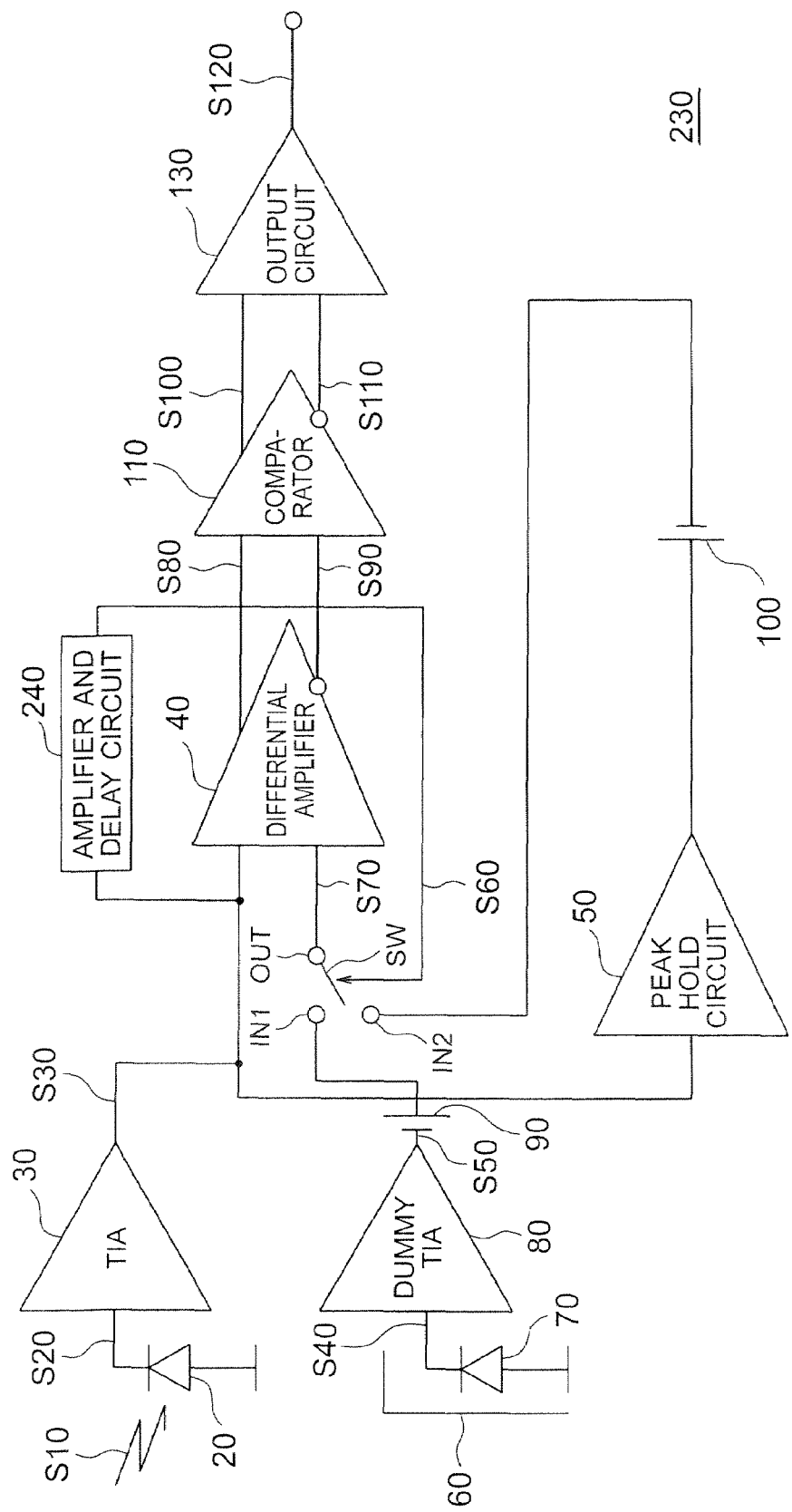

Also, as shown in FIG. 7, based on a switching signal S60 generated by causing the amplifier and delay circuit 240 to amplify and delay a voltage signal S30 outputted from the trans-impedance amplifier 30, the connection status of the switch SW may be changed.

Figure 8:
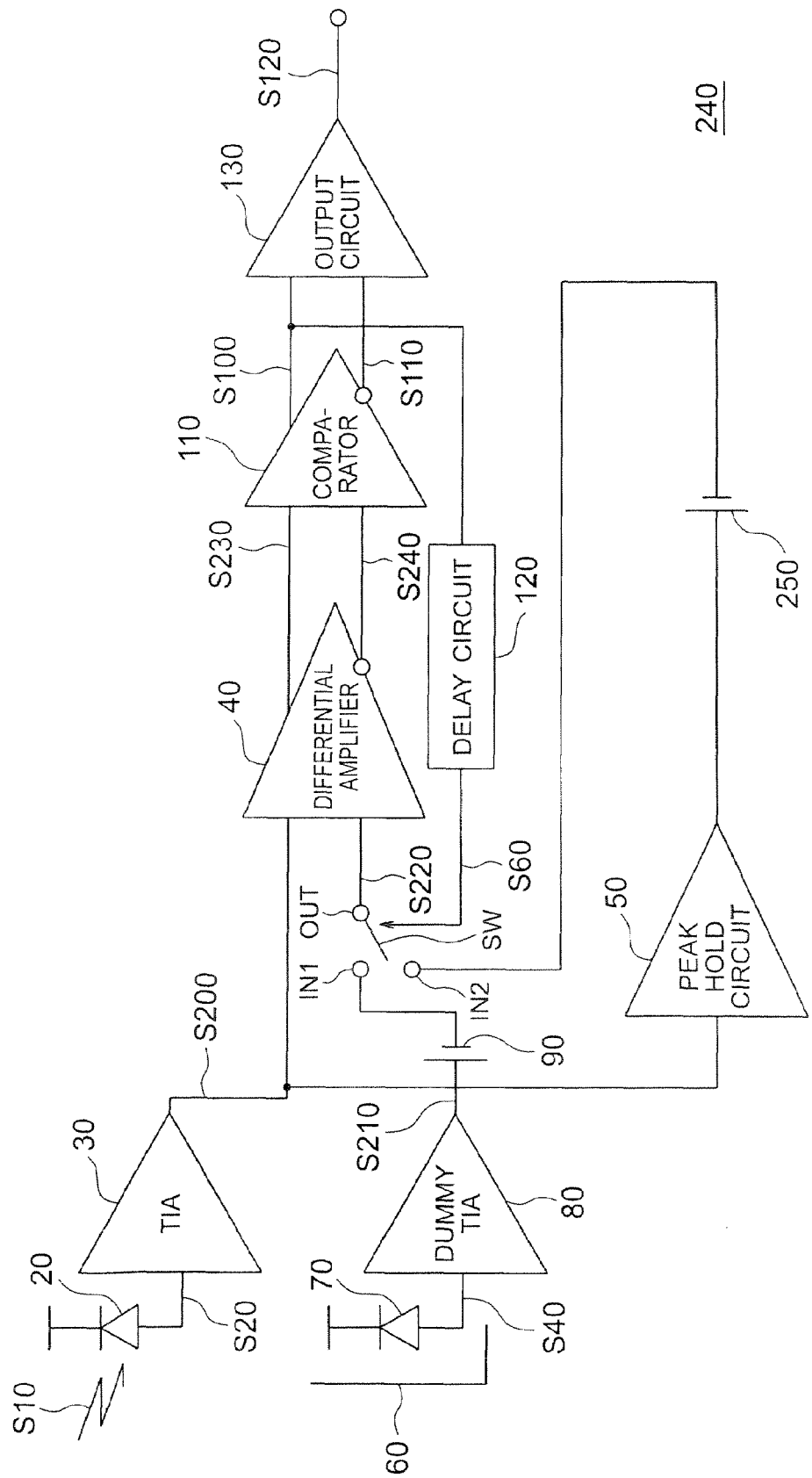

Also, as shown in FIG. 8, it is possible that the anode of the photodiode 20 is connected to the power source terminal and the cathode thereof to the input terminal of the trans-impedance amplifier 30.

In this case, it is required that, to the output terminal of the dummy trans-impedance amplifier 80, there is connected the positive pole of the constant voltage source 90 causing voltage VA to be generated, and the negative pole of that constant voltage source 90 is connected to the first input terminal IN1 of the switch SW and at the same time, to the output terminal of the peak hold circuit 50, there is connected the positive pole of a constant voltage source 250 causing voltage VB to be generated, and the negative pole of that constant voltage source 250 is connected to the second input terminal IN2 of the switch SW.

Voltage signals S200 to S240 obtained in the receiving apparatus 240 described above have signal waveforms obtained by inverting the signal waveforms of the respective corresponding signals (FIG. 2(B), FIG. 2(C), and FIG. 2(E)) obtained in the receiving apparatus 10.

Figure 9:
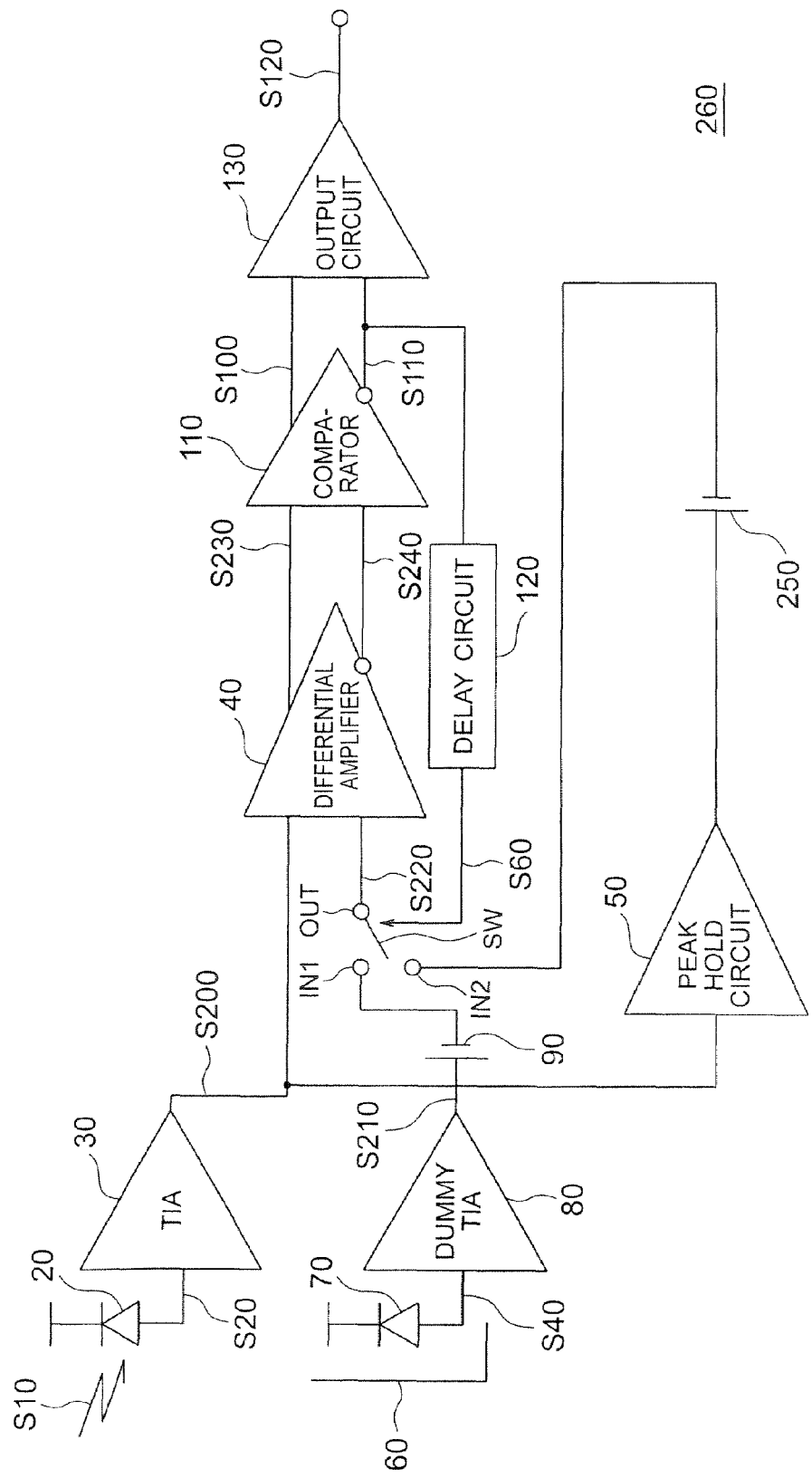

Also, as shown in FIG. 9, in the receiving apparatus 240, based on a voltage signal S110 obtained by inverting a voltage signal S100 and outputted from the second output terminal of the comparator 110, the connection status of the switch SW may be changed.

Figure 10:
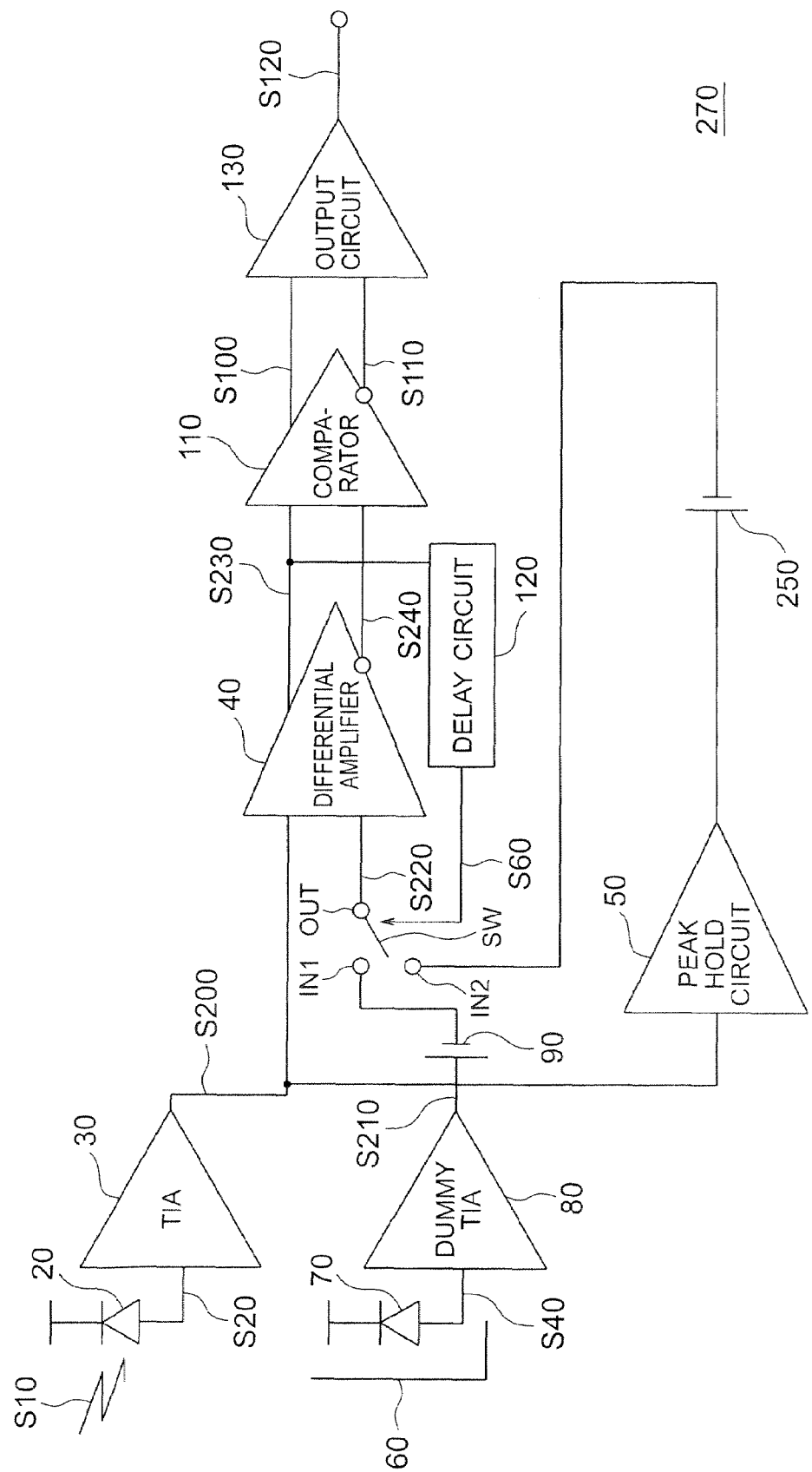
Figure 11:
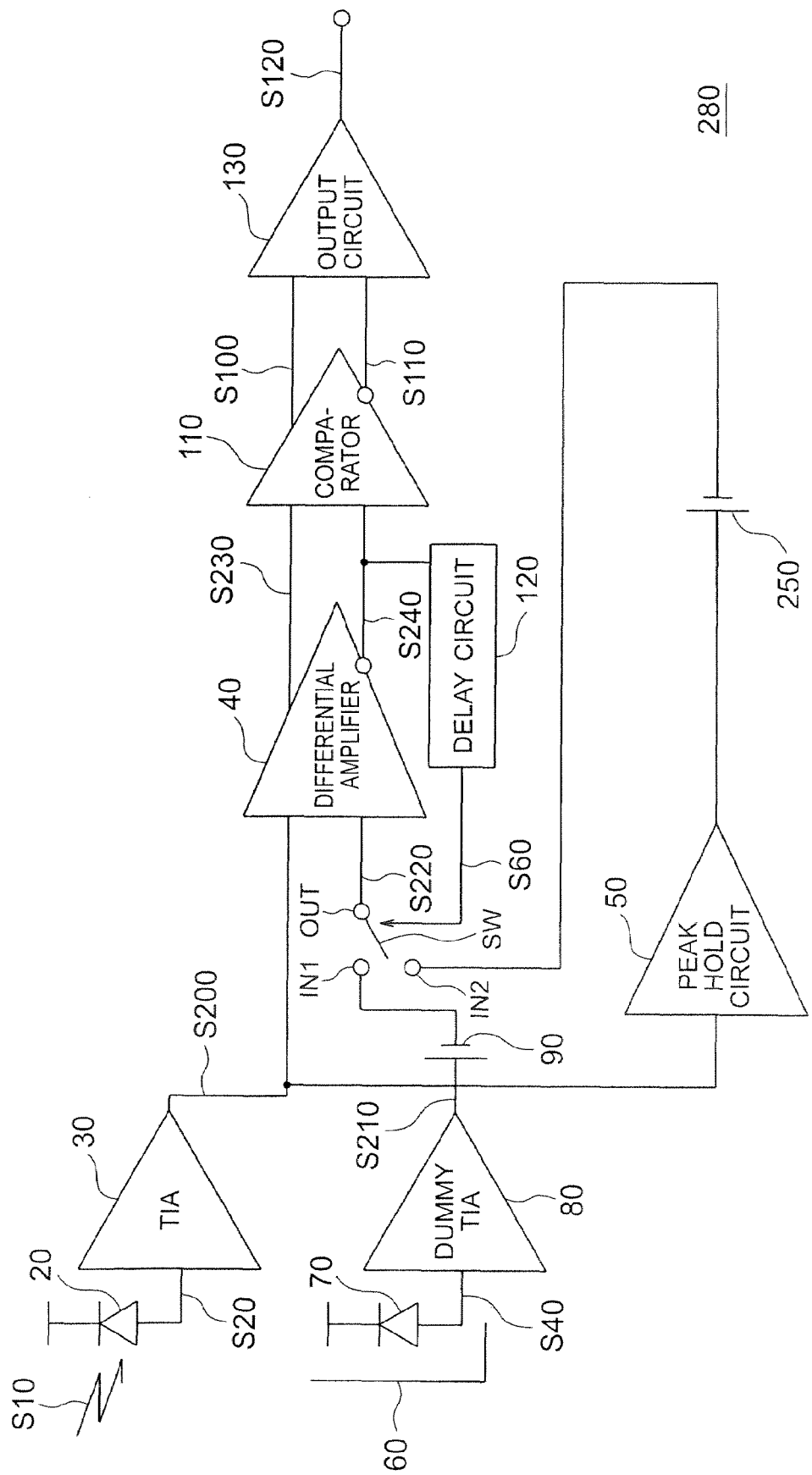

Also, as shown in FIG. 10, in the receiving apparatus 240, based on a voltage signal S230 outputted from the first output terminal of the differential amplifier 40, the connection status of the switch SW may be changed. Also, as shown in FIG. 11, in the receiving apparatus 240, based on a voltage signal S240 obtained by inverting a voltage signal S230 and outputted from the second output terminal of the differential amplifier 40, the connection status of the switch SW may be changed.

What is claimed is:

1. A receiving apparatus comprising:
  a light receiving unit which receives an optical signal and generates a current signal dependent on the optical signal;
  a conversion unit which converts the current signal into a voltage signal;
  a first threshold voltage generation unit which generates a first threshold voltage lower than substantially half of a peak voltage of the voltage signal;
  a second threshold voltage generation unit which generates a second threshold voltage lower by the first threshold voltage than the peak voltage of the voltage signal;
  a selection unit which, when the voltage signal changes from a first potential to a second potential higher than the first potential, selects and outputs the second threshold voltage after the voltage signal exceeding the first threshold voltage, and when the voltage signal changes from the second potential to the first potential, selects and outputs the first threshold voltage after the voltage signal falling below the second threshold voltage; and a comparison unit which compares the voltage signal with the first or second threshold voltage outputted from the selection unit.

2. The receiving apparatus according to claim 1, wherein the selection unit selects and outputs the first threshold voltage when the voltage signal changes from the first potential to the second potential higher than the first potential.

3. The receiving apparatus according to claim 1, wherein the selection unit selects and outputs the second threshold voltage when the voltage signal changes from the second potential to the first potential.

4. The receiving apparatus according to claim 1, wherein the selection unit selects and outputs the first threshold voltage when the voltage signal changes from the first potential to the second potential higher than the first potential, and selects and outputs the second threshold voltage when the voltage signal changes from the second potential to the first potential.

5. The receiving apparatus according to claim 1, wherein the first threshold voltage generation unit has a constant voltage source generating the first threshold voltage.

6. The receiving apparatus according to claim 1, wherein the second threshold voltage generation unit includes:

a peak hold circuit which holds the peak voltage of the voltage signal; and a constant voltage source which generates the first threshold voltage and lowering the peak voltage outputted from the peak hold circuit by the first threshold voltage.

7. The receiving apparatus according to claim 1, further comprising a delay circuit which delays an output signal outputted from the comparison unit by a predetermined time period, wherein the selection unit is constituted of a switching element and changes, based on the output signal delayed by the predetermined time period by the delay circuit, a connection status thereof and thereby selects and outputs the first or second threshold voltage.

8. The receiving apparatus according to claim 7, wherein: the comparison unit is constituted of a differential amplifier and a comparator connected in series; and of a first and second output terminal included in the comparator, the delay circuit delays the output signal outputted from an output terminal of the comparator by the predetermined time period.

9. The receiving apparatus according to claim 7, wherein: the comparison unit is constituted of a differential amplifier and a comparator connected in series; and of a first and second output terminal included in the differential amplifier, the delay circuit delays the output signal outputted from an output terminal of the differential amplifier by the predetermined time period.

10. The receiving apparatus according to claim 1, further comprising an amplifying delay circuit which amplifies and delays the voltage signal outputted from the conversion unit, wherein the selection unit is constituted of a switching element and changes, based on the output signal amplified and delayed by the amplifying delay circuit, a connection status thereof and thereby selects and outputs the first or second threshold voltage.

11. A receiving method comprising:

receiving an optical signal and generating a current signal dependent on the optical signal;

converting the current signal into a voltage signal;

generating a first threshold voltage lower than substantially half of a peak voltage of the voltage signal;

generating a second threshold voltage lower by the first threshold voltage than the peak voltage of the voltage signal;

selecting the second threshold voltage after the voltage signal exceeding the first threshold voltage, when the voltage signal changes from a first potential to a second potential higher than the first potential, and selecting the first threshold voltage after the voltage signal falling below the second threshold voltage, when the voltage signal changes from the second potential to the first potential; and comparing the voltage signal with the first or second threshold voltage thus selected.

12. The receiving method according to claim 11, wherein in the selection, the first threshold voltage is selected and outputted when the voltage signal changes from the first potential to the second potential higher than the first potential.

13. The receiving method according to claim 11, wherein in the selection, the second threshold voltage is selected and outputted when the voltage signal changes from the second potential to the first potential.

14. The receiving method according to claim 11, wherein in the selection, the first threshold voltage is selected and outputted when the voltage signal changes from the first potential to the second potential higher than the first potential, and the second threshold voltage is selected and outputted when the voltage signal changes from the second potential to the first potential.

15. The receiving method according to claim 11, wherein in generating the first threshold voltage, a constant voltage source generating the first threshold voltage is used to generate the first threshold voltage.

16. The receiving method according to claim 11, wherein in generating the second threshold voltage, the peak voltage of the voltage signal is held, and the peak voltage thus held is lowered by the first threshold voltage to generate the second threshold voltage.

17. The receiving method according to claim 11, wherein an output signal outputted from the comparison unit comparing the voltage signal with the first or second threshold voltage is delayed by a predetermined time period, and in selecting the first or second threshold voltage, the first or second threshold voltage is selected based on the output signal thus delayed by the predetermined time period.

18. The receiving method according to claim 17, wherein the comparison unit is constituted of a differential amplifier and a comparator connected in series, and of a first and second output terminal included in the comparator, the output signal outputted from an output terminal of the comparator is delayed by the predetermined time period.

19. The receiving method according to claim 17, wherein the comparison unit is constituted of a differential amplifier and a comparator connected in series, and of a first and second output terminal included in the differential amplifier, the output signal outputted from an output terminal of the differential amplifier is delayed by the predetermined time period.

20. The receiving method according to claim 11, wherein the voltage signal outputted from the conversion unit is amplified and delayed, and in selecting the first or second threshold voltage, the first or second threshold voltage is selected based on the output signal thus amplified and delayed.

* * * * *